(12) United States Patent
Rathert et al.

(10) Patent No.: US 11,624,775 B2
(45) Date of Patent: Apr. 11, 2023

(54) SYSTEMS AND METHODS FOR SEMICONDUCTOR DEFECT-GUIDED BURN-IN AND SYSTEM LEVEL TESTS

(71) Applicant: KLA Corporation, Milpitas, CA (US)

(72) Inventors: Robert J. Rathert, Mechanicsville, VA (US); David W. Price, Austin, TX (US); Chet V. Lenox, Lexington, TX (US); Oreste Donzella, San Ramon, CA (US); John Charles Robinson, Austin, TX (US)

(73) Assignee: KLA Corporation, Milpitas, CA (US)

( * ) Notice: Subject to any disclaimer, the term of this patent is extended or adjusted under 35 U.S.C. 154(b) by 91 days.

(21) Appl. No.: 17/372,292

(22) Filed: Jul. 9, 2021

(65) Prior Publication Data

US 2022/0390505 A1 Dec. 8, 2022

Related U.S. Application Data

(60) Provisional application No. 63/197,509, filed on Jun. 7, 2021.

(51) Int. Cl.
*G01R 31/28* (2006.01)
*H01L 21/66* (2006.01)

(52) U.S. Cl.
CPC ............ *G01R 31/287* (2013.01); *H01L 22/20* (2013.01)

(58) Field of Classification Search
CPC .............. G01R 31/287; G01R 31/2851; G01R 31/2855; H01L 21/20
See application file for complete search history.

(56) References Cited

U.S. PATENT DOCUMENTS 7,194,366 B2 3/2007 Singh et al.
7,739,064 B1 6/2010 Ryker et al.
(Continued)

FOREIGN PATENT DOCUMENTS

KR 1020190123792 A 11/2019

OTHER PUBLICATIONS

Chen, H.H., "Beyond structural test, the rising need for system-level test," 2018 International Symposium on VLSI Design, Automation and Test (VLSI-DAT), 2018, pp. 1-4, doi: 10.1109/VLSI-DAT.2018.8373238.
(Continued)

*Primary Examiner* — Manuel L Barbee
(74) *Attorney, Agent, or Firm* — Suiter Swantz pc llo

(57) ABSTRACT

Systems and methods for semiconductor defect-guided burn-in and system level tests (SLT) are configured to receive a plurality of inline defect part average testing (I-PAT) scores from an inline defect part average testing (I-PAT) subsystem, where the plurality of I-PAT scores is generated by the I-PAT subsystem based on semiconductor die data for a plurality of semiconductor dies, where the semiconductor die data includes characterization measurements for the plurality of semiconductor dies, where each I-PAT score of the plurality of I-PAT scores represents a defectivity determined by the I-PAT subsystem based on a characterization measurement of a corresponding semiconductor die of the plurality of semiconductor dies; apply one or more rules to the plurality of I-PAT scores during a dynamic decision-making process; and generate one or more defect-guided dispositions for at least one semiconductor die of the plurality of semiconductor dies based on the dynamic decision-making process.

25 Claims, 6 Drawing Sheets

(56) References Cited

U.S. PATENT DOCUMENTS

| | | |
|---|---|---|
| 10,761,128 B2 | 9/2020 | Price et al. |
| 2003/0120457 A1 | 6/2003 | Singh et al. |
| 2013/0007546 A1 | 1/2013 | Grady et al. |
| 2017/0343601 A1 | 11/2017 | Casatuta et al. |
| 2018/0275189 A1* | 9/2018 | Price ................. G06F 17/18 |
| 2019/0295908 A1 | 9/2019 | Rathert et al. |

OTHER PUBLICATIONS

Polian et al., "Exploring the Mysteries of System-Level Test," 2020 IEEE 29th Asian Test Symposium (ATS), 2020, pp. 1-6, doi: 10.1109/ATS49688.2020.9301557.
Search Report and Written Opinion in International Application No. PCT/US2022/031853 dated Sep. 21, 2022, 6 pages.

\* cited by examiner

SYSTEMS AND METHODS FOR SEMICONDUCTOR DEFECT-GUIDED BURN-IN AND SYSTEM LEVEL TESTS

CROSS-REFERENCE TO RELATED APPLICATION

The present application claims the benefit of U.S. Provisional Application Ser. No. 63/197,509, filed on Jun. 7, 2021, which is incorporated herein by reference in the entirety.

TECHNICAL FIELD

The present disclosure relates generally to semiconductor devices and, more particularly, to systems and methods for semiconductor defect-guided burn-in and system level tests.

BACKGROUND

Fabrication of semiconductor devices may typically require hundreds or thousands of processing steps to form a functioning device. Over the course of these processing steps, various characterization measurements (e.g., inspection and/or metrology measurements) may be performed to identify defects and/or monitor various parameters on the devices. Electrical testing may be performed instead of or in addition to the various characterization measurements to verify or assess the functionality of the device. However, while some detected defects and metrology errors may be so significant as to clearly indicate a device failure, lesser variations may cause early reliability failures of the device after exposure to a working environment. Risk-averse users of semiconductor devices are now looking for failure rates in the parts-per-billion (PPB) range, exceeding current parts-per-million (PPM) levels. Evaluating the reliability of semiconductor dies is key to meeting requirements as the need for semiconductor devices in applications continues to increase.

SUMMARY

A system is disclosed, in accordance with one or more embodiments of the present disclosure. In one illustrative embodiment, the system includes a defect-guided disposition controller communicatively coupled to an inline defect part average testing (I-PAT) subsystem. In another illustrative embodiment, the defect-guided disposition controller includes one or more processors and memory. In another illustrative embodiment, the memory is configured to store a set of program instructions. In another illustrative embodiment, the one or more processors are configured to execute program instructions causing the one or more processors to receive a plurality of inline defect part average testing (I-PAT) scores from the I-PAT subsystem. In another illustrative embodiment, the plurality of I-PAT scores is generated by the I-PAT subsystem based on semiconductor die data for a plurality of semiconductor dies. In another illustrative embodiment, the semiconductor die data includes characterization measurements for the plurality of semiconductor dies. In another illustrative embodiment, each I-PAT score of the plurality of I-PAT scores represents a defectivity determined by the I-PAT subsystem based on a characterization measurement of a corresponding semiconductor die of the plurality of semiconductor dies. In another illustrative embodiment, the one or more processors are configured to execute program instructions causing the one or more processors to apply one or more rules to the plurality of I-PAT scores during a dynamic decision-making process. In another illustrative embodiment, the one or more processors are configured to execute program instructions causing the one or more processors to generate one or more defect-guided dispositions regarding at least one of burn-in or a system level test (SLT) for at least one semiconductor die of the plurality of semiconductor dies based on the dynamic decision-making process.

A method is disclosed, in accordance with one or more embodiments of the present disclosure. In one illustrative embodiment, the method may include, but is not limited to, receiving, via a defect-guided disposition controller, a plurality of inline defect part average testing (I-PAT) scores from an inline defect part average testing (I-PAT) subsystem. In another illustrative embodiment, the plurality of I-PAT scores is generated by the I-PAT subsystem based on semiconductor die data for a plurality of semiconductor dies. In another illustrative embodiment, the semiconductor die data includes characterization measurements for the plurality of semiconductor dies. In another illustrative embodiment, each I-PAT score of the plurality of I-PAT scores represents a defectivity determined by the I-PAT subsystem based on a characterization measurement of a corresponding semiconductor die of the plurality of semiconductor dies. In another illustrative embodiment, the method may include, but is not limited to, applying, via the defect-guided disposition controller, one or more rules to the plurality of I-PAT scores during a dynamic decision-making process. In another illustrative embodiment, the method may include, but is not limited to, generating, via the defect-guided disposition controller, one or more defect-guided dispositions regarding at least one of burn-in or a system level test (SLT) for at least one semiconductor die of the plurality of semiconductor dies based on the dynamic decision-making process.

A system is disclosed, in accordance with one or more embodiments of the present disclosure. In one illustrative embodiment, the system includes an inline defect part average testing (I-PAT) subsystem, wherein the I-PAT subsystem is configured to receive semiconductor die data for a plurality of semiconductor dies and generate a plurality of inline defect part average testing (I-PAT) scores based on the semiconductor die data. In another illustrative embodiment, the semiconductor die data includes characterization measurements for the plurality of semiconductor dies. In another illustrative embodiment, each I-PAT score of the plurality of I-PAT scores represents a defectivity determined by the I-PAT subsystem based on a characterization measurement of a corresponding semiconductor die of the plurality of semiconductor dies. In another illustrative embodiment, the system includes a defect-guided disposition controller communicatively coupled to the I-PAT subsystem. In another illustrative embodiment, the defect-guided disposition controller includes one or more processors and memory. In another illustrative embodiment, the memory is configured to store a set of program instructions. In another illustrative embodiment, the one or more processors are configured to execute program instructions causing the one or more processors to receive the plurality of I-PAT scores from the I-PAT subsystem. In another illustrative embodiment, the one or more processors are configured to execute program instructions causing the one or more processors to apply one or more rules to the plurality of I-PAT scores during a dynamic decision-making process. In another illustrative embodiment, the one or more processors are configured to execute program instructions causing the one or more processors to generate one or more defect-guided dispositions regarding at least one of burn-in or a system level test (SLT) for at least one semiconductor die of the plurality of semiconductor dies based on the dynamic decision-making process.

It is to be understood that both the foregoing general description and the following detailed description are exemplary and explanatory only and are not necessarily restrictive of the invention as claimed. The accompanying drawings, which are incorporated in and constitute a part of the specification, illustrative embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1:
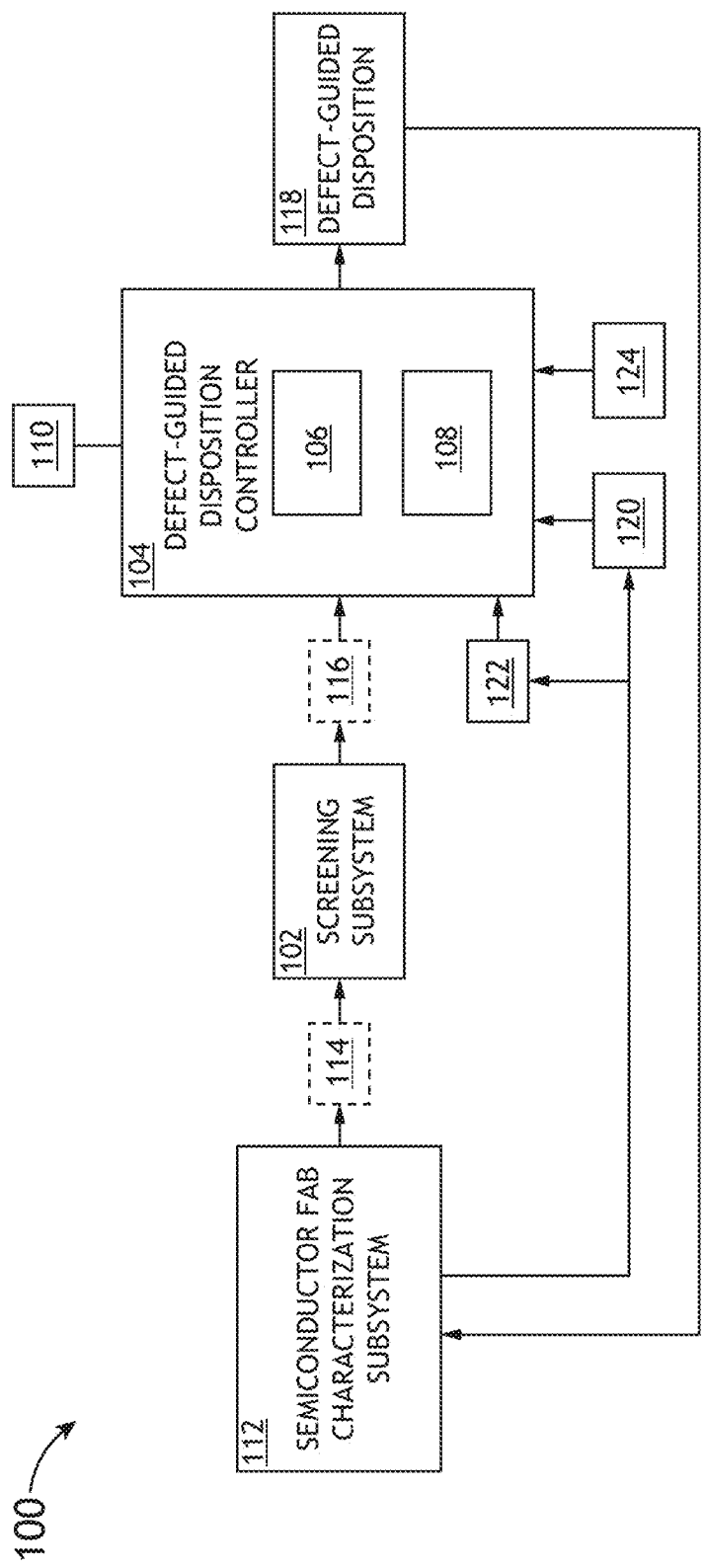
FIG. 1 is a block diagram view of a system for semiconductor defect-guided burn-in and system level tests (SLT), in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Fabrication of semiconductor devices may typically require hundreds or thousands of processing steps to form a functioning device. Over the course of these processing steps, various characterization measurements (e.g., inspection and/or metrology measurements) may be performed to identify defects and/or monitor various parameters on the devices. Electrical testing may be performed instead of or in addition to the various characterization measurements to verify or assess the functionality of the device.

However, while some detected defects and metrology errors may be so significant as to clearly indicate a device failure, lesser variations may cause early reliability failures of the device after exposure to a working environment. Defects arising during the manufacturing process may have a wide range of impacts on the performance of the device in the field. For example, "killer" defects occurring in known or unknown locations within designs may result in immediate device failure. For instance, killer defects in unknown locations may be particularly problematic where they have a susceptibility to reliability escapes in test gaps, where a semiconductor device may be functionally dead after processing but the device maker is unable to make this disposition due to limitations in testing. By way of another example, minor defects may have little or no impact on the performance of the device throughout the device lifetime. By way of another example, a class of defects known as latent reliability defects (LRD) may not lead to failure during manufacturing/testing or may not lead to immediate device failure during operation, but may lead to early-life failure of the device during operation when used in a working environment. It is noted herein the terms "manufacturing process" and "fabrication process" may be considered equivalent, along with respective variants of the terms (e.g., "manufacturing line" and "fabrication line", and the like), for purposes of the present disclosure.

Risk-averse users of semiconductor devices (e.g., in automotive, military, aeronautical, industrial, and/or medical applications) may require failure rates in the parts-per-billion (PPB) range, exceeding current parts-per-million (PPM) levels. For example, semiconductor devices in mission or safety critical functions such as automotive, military, aerospace, industrial, and/or medical applications are held to a higher quality and reliability standard than consumer devices. Evaluating the reliability of semiconductor dies is key to meeting requirements as the need for semiconductor devices in automotive, military, aerospace, industrial, and/or medical applications continues to increase.

Semiconductor device suppliers have attempted to maximize the available test coverage on conventional automatic test equipment (ATE) testers in an effort to reach quality goals and identify at-risk semiconductor die. However, test coverage gaps, test fault model limitations or deficiencies, and/or LRD may still allow an unsatisfactory level of low reliability die to escape into the supply chain.

To address the unsatisfactory level of escapes, a "burn-in" step may be added to stress the packaged die with vibration, temperature (e.g., hot or cold), humidity, and/or a range of electrical conditions outside of semiconductor device specifications in an effort to activate any latent failures present. In addition to being slow and costly, though, the burn-in step provides an undesirable risk of potentially damaging otherwise healthy die. In addition, a system level test (SLT) may be used to address the unsatisfactory level of escapes, which may occur individually, sequentially, concurrently, or simultaneously as burn-in. SLT involves semiconductor dies being inserted into testers that mimic a real-world function of an operational chip to validate its internal timing paths and functional interfaces. This mimicking may reveal failures not seen on ATE testers. However, one trade-off is that SLT test times are often several minutes long, as compared to seconds on the ATE tester, making it extremely costly and slow. It is noted herein a description of SLT may be found in I. Polian et al., "Exploring the Mysteries of System-Level Test," 2020 *IEEE 29th Asian Test Symposium (ATS)*, 2020, pp. 1-6, doi: 10.1109/ATS49688.2020.9301557. In addition, it is noted herein a description of SLT may be found in H. H. Chen, "Beyond structural test, the rising need for system-level test," 2018 *International Symposium on VLSI Design, Automation and Test (VLSI-DAT)*, 2018, pp. 1-4, doi: 10.1109/VLSI-DAT.2018.8373238.

Semiconductor devices in quality critical roles may undergo extensive electrical testing, both during wafer sort and again at final test after singulation and packaging. This phase of production is under conflicting pressures to both reduce quality escapes and lower costs by shortening test times.

For example, known testing techniques may rely primarily on preliminary electrical data from wafer sort or statistical prediction of electrical test trends and yield results from previous lots and neighboring die to shape the test strategy. The manufacturing process control information is too sparse to shape the test strategy at an individual device level, however, as sampling encompassed only 1-2% of production material. In addition, the known testing techniques lack die-level manufacturing defect and/or metrology information that assists risk prediction. Further, relying only on electrical wafer sort data may overlook the potential presence of LRD in shaping defect-guided tests, as un-activated LRD are invisible to electrical testing. Further, statistical-based predictive algorithms lack provenance data about the semiconductor die undergoing testing, and may miss individual outliers caused by a localized manufacturing deviation. Further, predictive algorithms based on historical feedback loops that pare a test set to only electrical tests may fail to overlook the unpredictable nature of manufacturing process excursions and the unexpected failures they can create. These shortcomings are especially problematic in a PPB testing environment, as they may create unacceptable risk.

In some instances, semiconductor die suppliers traditionally have relied primarily on electrical test data and/or statistical sampling to decide which population of semiconductor die should undergo burn-in and/or SLT. However, the previous methods lacked appropriate manufacturing die-level defect or metrology outlier data aggregated across multiple layers to assist risk prediction when choosing the population to undergo burn-in and/or SLT.

By way of another example, relying primarily on electrical test data to choose the population of die for burn-in and/or SLT may overlook reliability mechanisms that do not manifest effectively in ATE testing, leading to escapes caused by test coverage gaps, test fault model limitations or deficiencies, and/or LRD. By way of another example, using statistical sampling to choose the population for burn-in and/or SLT may overlook highly defective die which pass tests but should be included in the supplementary steps. By way of another example, existing methods overlook available details about defect layer, type and location that may be relevant in better assessing a die's ultimate field reliability. By way of another example, semiconductor die suppliers may be uncertain if burn-in and/or SLT was appropriate for the defects present (and may be avoided). By way of another example, defect data may be useful in analyzing the root cause of failures in SLT, which is missing from known methods. By way of another example, any currently-implemented model is costly and difficult to optimize, leading to either inefficiencies and potential die damage from choosing too large a population, and/or leading to risk of escapes from sampling the wrong subset. It is noted herein United States Patent Publication No. US 2003/0120457 A1, published Jun. 26, 2003, which issued as U.S. Pat. No. 7,194,366 B2 on Mar. 20, 2007, employs limited defect clustering on defects in a same area to perform this role, but the described using of defect clustering on a single layer overlooks the aggregate effects of total defectivity of a die in three dimensions (3D) and does not consider weightings applied by type, layer, locations, or the like.

As such, there exists a need to optimize which semiconductor die undergo the supplementary steps of burn-in and/or SLT. For example, in the most conservative scenarios it may be up to 100% of semiconductor die, resulting in greatly-increased costs. By way of another example, a semiconductor die supplier may try to rely on information gleaned during testing and/or statistical modeling to sub-sample (e.g., sample only a portion of) the semiconductor device population, relying on electrical data which has inherent gaps. By way of another example, defect clustering information from a single process layer may be used, but this method is incomplete in the absence of 100% screening and outlier detection of weighted aggregate defectivity, which may create risks and/or poor optimization.

In this regard, it would be beneficial to provide systems and methods for semiconductor defect-guided burn-in and SLT. In the provided systems and methods, data identifying highly defective die from inline defect part average testing (I-PAT) screenings in the fab may supplement existing methods, allowing for a better-informed decision regarding which die undergo burn-in and/or SLT. For example, costs may be reduced by eliminating burn-in and/or SLT on low-defectivity semiconductor die that are healthy. By way of another example, semiconductor die quality may be improved by ensuring only at-risk semiconductor die go through the supplementary burn-in steps while healthy semiconductor die avoid possible damage at these steps. By way of another example, escapes may be reduced by ensuring highly defective semiconductor die are included in the sample of burn-in and/or SLT. It is noted herein systems and methods for I-PAT are described in U.S. Pat. No. 10,761,128, issued Sep. 1, 2020, incorporated herein in the entirety.

Shortcomings of ATE-based structural testing to reveal all defect types may affect device reliability in the field. To counter this, burn-in and/or SLT to complement structural testing and close some of its gaps to serve both outgoing and incoming quality control needs may be desired. However, the addition of burn-in and/or SLT may be under severe cost-of test reduction pressure. For example, supplemental methods take significant time, and as such the industry desires ways to optimize the population and parameters of these steps. Methods based primarily on electrical test data have inherent gaps, but by bringing inline defect inspection and/or metrology I-PAT outlier data for each semiconductor die into the decision process, a correlated but separate data source may result from which the appropriate die for burn-in and/or SLT may be proactively chosen and parameters of these steps may be shaped to reduce costs while improving quality.

Embodiments of the present disclosure are directed to systems and methods for semiconductor defect-guided burn-in and SLT. Embodiments of the present disclosure are also directed to providing a more effective method to determine which semiconductor die are directed to burn-in and/or SLT. Embodiments of the present disclosure are directed to using weighted, aggregate screening data (e.g., weighted, aggregate inline defect and/or metrology outlier data from I-PAT or other screening methods) in the optimization of burn-in and/or SLT. Embodiments of the present disclosure are directed to assessing if individual "at-risk" die should undergo burn-in, SLT, or both. Embodiments of the present disclosure are directed to merging I-PAT data with electrical test data and statistical sampling models to determine which "low-risk" die are appropriate to not perform (e.g., skip) burn-in and/or SLT, and which "high-risk" die should be culled before burn-in and/or SLT. Embodiments of the present disclosure are directed to modifying the content and duration of the burn-in and/or system level test program parameters using inline defect data from screening inspections in the manufacturing fab.

Figure 2:
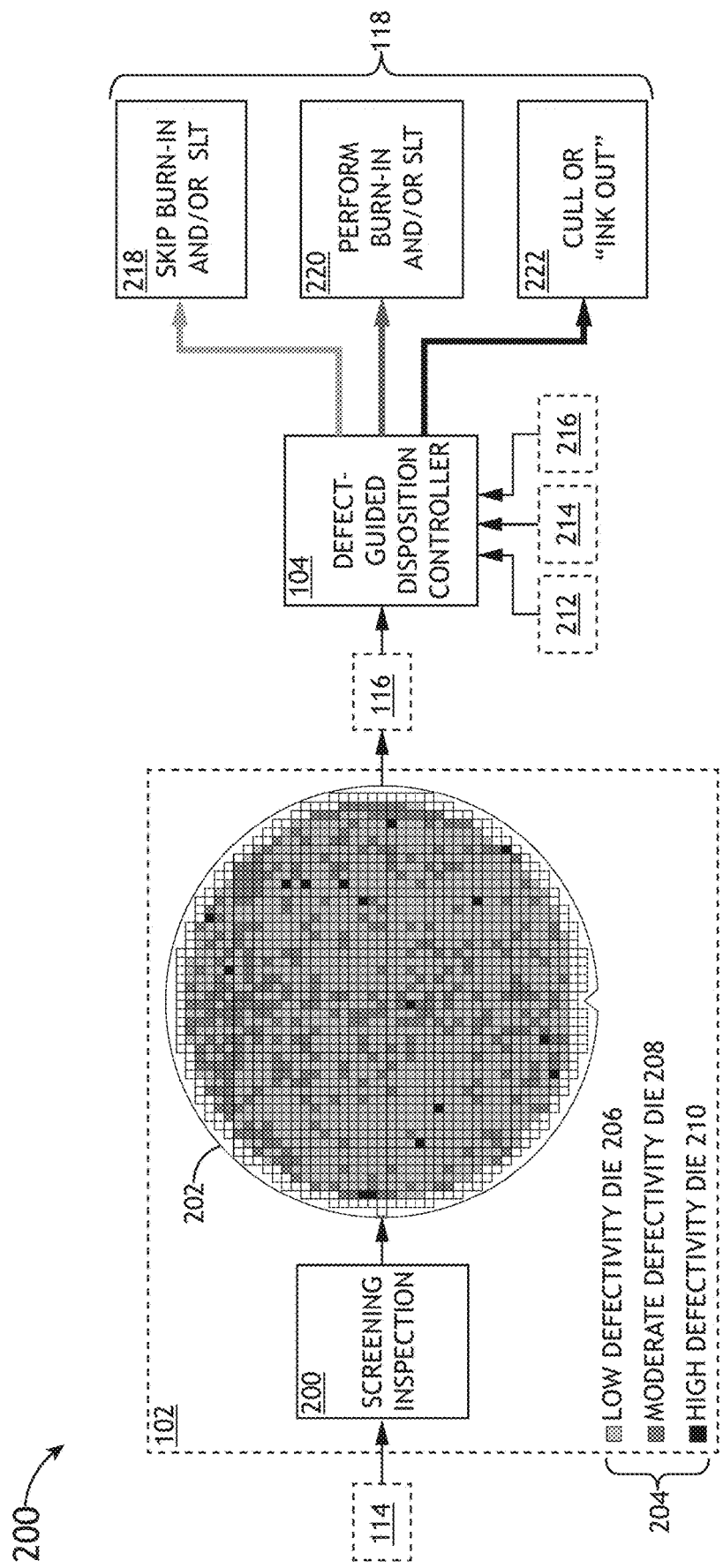
FIG. 2 is a conceptual illustration of a system for semiconductor defect-guided burn-in and system level tests (SLT), in accordance with one or more embodiments of the present disclosure.

FIGS. 1 and 2 in general illustrate block diagram views of a system 100 for semiconductor defect-guided burn-in and system level tests (SLT), in accordance with one or more embodiments of the present disclosure. It is noted herein the system 100 may be utilized for determining an overall strategy for insertions (e.g., wafer sort, packaging, burn-in, SLT, or the like) in the fab process.

In some embodiments, the system 100 includes a screening subsystem 102. For example, the screening subsystem 102 may include or be configured to perform inline defect part average testing (I-PAT) processes or other screening processes, such that the screening subsystem 102 is an I-PAT subsystem 102. Example uses of I-PAT methodologies are described in U.S. Pat. No. 10,761,128, issued Sep. 1, 2020, previously incorporated herein in the entirety.

In some embodiments, the system 100 includes a defect-guided disposition controller 104 (or defect-guided test server). for example, the defect-guided disposition controller 104 may be a semiconductor die burn-in and SLT optimizer. The defect-guided disposition controller 104 may include one or more processors 106 configured to execute program instructions maintained on or stored in memory 108 (e.g., a memory medium, memory device, or the like). It is noted herein the one or more processors 106 of the defect-guided disposition controller 104 may execute any of the various process steps described throughout the present disclosure. for example, the one or more processors 106 may be configured to receive semiconductor die data from a semiconductor fab characterization subsystem, generate weighted, aggregate scores about semiconductor dies from the semiconductor die data with a screening subsystem, apply defined rules to at least the weighted, aggregate scores during a dynamic decision-making process, generate defect-guided dispositions for at least some of the semiconductor dies based on the dynamic decision-making process, and/or determine adjustments based on outputs from defect-guided tests performed following the defect-guided dispositions.

The system 100 may include a user interface 110 coupled (e.g., physically coupled, electrically coupled, communicatively coupled, or the like) to the defect-guided disposition controller 104. For example, the user interface 110 may be a separate device coupled to the defect-guided disposition controller 104. By way of another example, the user interface 110 and the defect-guided disposition controller 104 may be located within a common or shared housing. It is noted herein, however, the defect-guided disposition controller 104 may not include, require, or be coupled to the user interface 110.

In some embodiments, the system 100 includes a semiconductor fab characterization subsystem 112 (or fab characterization subsystem 112, for purposes of the present disclosure) coupled (e.g., physically coupled, electrically coupled, communicatively coupled, or the like) to the screening subsystem 102. The semiconductor fab characterization subsystem 112 may transmit semiconductor data 114, which may be received by the screening subsystem 102. For example, the semiconductor data 114 may be transmitted directly between the semiconductor fab characterization subsystem 112 and the screening subsystem 102. By way of another example, the semiconductor data 114 may be transmitted between the semiconductor fab characterization subsystem 112 and the screening subsystem 102 via one or more auxiliary controllers or servers. As such, examples of systems, subsystems, or controllers or servers as described throughout the present disclosure are provided solely for illustrative purposes and should not be interpreted as limiting.

The semiconductor data 114 may be uploaded to the screening subsystem 102 as a standardized data format shared by the semiconductor fab characterization subsystem 112 and the screening subsystem 102. For example, the standardized data format may be formatted for use with different operating systems including, but not limited to, Android, Apple iOS, Microsoft Windows, Apple macOS, Linux, ChromeOS, Unix, Ubuntu, or the like. It is noted herein, however, the fabrication environment may use a first type of file format, while the I-PAT environment may use a different type of file format.

As such, the semiconductor data 114 may be a non-standardized fabrication data format requiring conversion. For example, the semiconductor fab characterization subsystem 112 may transmit the semiconductor data 114 in the non-standardized fabrication data format to the screening subsystem 102, and the screening subsystem 102 may convert the semiconductor data 114 into a standardized testing data format following receipt. By way of another example, the semiconductor fab characterization subsystem 112 may convert the semiconductor data 114 into a standardized testing data format prior to transmission to the screening subsystem 102. In addition, the semiconductor data 114 may be uploaded to the screening subsystem 102 as a proprietary data format specific to the fabrication environment and/or the testing environment. Further, the semiconductor data 114 may be shared using encrypted data (e.g., via daemons), web or cloud interfaces, or other secure connections using die traceability to ensure the semiconductor data 114 stays synchronized.

The screening subsystem 102 may receive the semiconductor data 114 and perform one or more screening processes 200 on the semiconductor data 114. The semiconductor data 114 may include information about a semiconductor wafer 202 of a plurality of semiconductor wafers 202, where each semiconductor wafer 202 of the plurality of semiconductor wafers 202 includes a plurality (e.g., 1, 2, . . . N number) of layers fabricated following a number (e.g., tens, hundreds, thousands) of steps performed by a number of fabrication processes, where each layer of the plurality of layers includes a plurality of semiconductor dies 204, where each semiconductor die 204 of the plurality of semiconductor dies 204 includes a plurality of blocks. In this regard, the semiconductor data 114 may include wafer-level data, layer-level data, die-level data, and/or block-level data. For purposes of the present disclosure, "semiconductor data" should be understood as including "semiconductor die data", such that "semiconductor data" and "semiconductor die data" may be considered equivalent. However, it is noted herein that "semiconductor data" is not intended to be limited to including only "semiconductor die data".

The one or more screening processes 200 may characterize the plurality of semiconductor dies 204. For example, each semiconductor die 204 of the plurality of semiconductor dies 204 may be characterized as either a low defectivity or "low-risk" (or "good") semiconductor die 206, a moderate defectivity or "at risk" semiconductor die 208, or a high defectivity or "high-risk" semiconductor die 210.

It is noted herein the characterization of the plurality of semiconductor dies 204 may occur for all (e.g., 100%) or a subset of the plurality of semiconductor dies 204 on a particular semiconductor wafer 202. In addition, it is noted herein the characterization of the plurality of semiconductor dies 204 may occur for all (e.g., 100%) or a subset of the plurality of semiconductor layers on a particular semiconductor wafer 202. For example, the subset of the plurality of semiconductor layers may include, but is not limited to, one or more layers determined to be wholly critical and/or include critical aspects. Further, it is noted herein the characterization of the plurality of semiconductor dies 204 may occur for all (e.g., 100%) or a subset of the plurality of semiconductor wafers 202.

Where the screening subsystem 102 is an I-PAT subsystem 102, with I-PAT scores potentially available for 100% of wafers and 100% of die, significant information about the relative health or quality of each die is usable and could be employed by test engineers to adjust burn-in and/or SLT. With the addition of I-PAT data, adjustment of burn-in and/or SLT may dynamically customize test content with low latency to reduce escapes, while simultaneously reducing the total cost of testing. In addition, with the addition of I-PAT data, the adjustment of burn-in and/or SLT may differ for each semiconductor die, potentially resulting in adjusted test time, different test content, or different test criteria for each semiconductor device under test. Example uses of I-PAT methodologies include U.S. Pat. No. 10,761,128, issued on Sep. 1, 2020, which is previously incorporated herein in the entirety.

In some embodiments, the screening subsystem 102 outputs a weighted, aggregate score 116 (or I-PAT score 116, where the screening subsystem 102 is an I-PAT subsystem 102), to the defect-guided disposition controller 104. The weighted, aggregate score 116 may represent the quantity and risk level of defects present in each semiconductor die 204 summed across each of the layers being screened, such that the weighted, aggregate score 116 is a die-level score. The weighted, aggregate score 116 may include the layer(s) at which the defect(s) occurred, including information about the x, y position within the semiconductor die(s) 204. The weighted, aggregate score 116 may describe the type of defect (e.g., short, open, or the like), size of the defect, inclusion in a cluster, or position (e.g., x, y position) on the wafer 202.

The weighted, aggregate score 116 may be binned with one or more pre-set outlier thresholds or custom user-defined outlier thresholds prior to being outputted to the defect-guided disposition controller 104. It is noted herein, however, the weighted, aggregate score 116 may be outputted to the defect-guided disposition controller 104 in an organizational form similar to that of the semiconductor die data 114.

The weighted, aggregate score 116 may be output to the defect-guided disposition controller 104 either directly or indirectly via one or more auxiliary servers or controllers. As such, examples of systems, subsystems, or controllers or servers as described throughout the present disclosure are provided solely for illustrative purposes and should not be interpreted as limiting.

The weighted, aggregate score 116 may be uploaded to the defect-guided disposition controller 104 as a standardized data format shared by the screening subsystem 102 and the defect-guided disposition controller 104. For example, the standardized data format may be formatted for use with different operating systems including, but not limited to, Android, Apple iOS, Microsoft Windows, Apple macOS, Linux, ChromeOS, Unix, Ubuntu, or the like. It is noted herein, however, the fabrication environment and/or the screening or I-PAT environment may use a first type of file format (e.g., defect data formats and KLARF file formats), while the post-fabrication testing environment may use a different type of file format (e.g., STDF file formats, BITdb file formats, or the like).

As such, the weighted, aggregate score 116 may be a non-standardized fabrication data format requiring conversion. For example, the screening subsystem 102 may transmit the weighted, aggregate score 116 in the non-standardized fabrication data format to the defect-guided disposition controller 104, and the defect-guided disposition controller 104 may convert the weighted, aggregate score 116 into a standardized testing data format following receipt. By way of another example, the screening subsystem 102 may convert the weighted, aggregate score 116 into a standardized testing data format prior to transmission to the defect-guided disposition controller 104. In addition, the weighted, aggregate score 116 may be uploaded to the defect-guided disposition controller 104 as a proprietary data format specific to the fabrication environment and/or the testing environment. Further, the weighted, aggregate score 116 may be shared using encrypted data (e.g., via daemons), web or cloud interfaces, or other secure connections using die traceability to ensure the weighted, aggregate score 116 for each semiconductor die 204 stays synchronized.

It is noted herein the distinctions of operating with "standardized data formats" and/or "non-standardized data formats" with respect to the screening subsystem 102, the defect-guided disposition controller 104, and/or the semiconductor fab characterization subsystem 112 is provided solely for illustrative purposes and should not be interpreted as limiting.

In some embodiments, the defect-guided disposition controller 104 generates one or more defect-guided dispositions 118 from the weighted, aggregate score 116. For example, the one or more defect-guided dispositions 118 may determine the sample or population of samples that will skip burn-in and/or SLT, undergo burn-in and/or SLT, and/or be culled or inked out. By way of another example, the one or more defect-guided dispositions 118 may determine the criteria, duration, and/or limits of the burn-in and/or SLT, for the sample or population of samples to undergo burn-in and/or SLT.

Using a set of user-defined rules or pre-set rules for criteria on the weighted, aggregate score 116 (and/or the contributory elements for and/or to the weighted, aggregate score 116), the defect-guided disposition controller 104 may use dynamic rule-based decision-making processes on the weighted, aggregate score 116 for each semiconductor die 204. For example, the dynamic rule-based decision-making processes may be used to make decisions regarding the content, duration, and/or criteria for tests run on each device under test depending on the quantity, type, location or layer of defects present. For instance, the dynamic rule-based decision-making processes may use the weighted, aggregate score 116 (and/or the contributory elements for and/or to the weighted, aggregate score 116) to make decisions on whether the semiconductor die should undergo burn-in and/or SLT.

User-defined rules include, but are not limited to, some combination of a number of failures, a degree of severity of one or more failures, or the like coupled with I-PAT information indicating an issue. It is noted herein the rules may be defined by experts, artificial intelligence (AI), or the like. For example, the rules may be determined through deterministic and/or statistical thresholding methods or processes, spatial signature analysis methods or processes, advanced deep learning or machine learning methods or processes, or the like. In general, the machine learning techniques may be any technique known in the art including, but not limited to, supervised learning, unsupervised learning, or other learning-based processes such as, but not limited to, linear regression, neural networks or deep neural networks, heuristic-based model, or the like.

It is noted herein the "dynamic" nature of the decision-making may be attributed to one or more of the receiving of the user-defined rules and subsequent adjusting of the decision-making processes, the continuous operation of the decision-making processes as the weighted, aggregate scores 116 are received, and/or the constant changing of the defect-guided dispositions 118 based on the application of the defined rules to generate the one or more defect-guided dispositions 118.

The defect-guided disposition controller 104 may use dynamic rule-based decision-making processes on the weighted, aggregate score 116 for each semiconductor die 204 alone, or may combine the dynamic rule-based decision-making processes with other processes and/or contributory elements such as other available test insertion or manufacturing data to affect the appropriate semiconductor die binning per the user-defined rules.

For example, the decision-making processes may receive die-level electrical sort data 212 from an electrical test subsystem 120 configured to perform electrical sort processes during wafer sort after a wafer lot is fully fabricated. For instance, the die-level electrical sort data 212 may include, but is not limited to, wafer probe data or other electrical test data received from the electrical test subsystem 120 during or following processes to electrically evaluate the semiconductor device functionality at the conclusion of a fabrication manufacturing process (e.g., electrical wafer sort (EWS) processes, or the like).

By way of another example, the decision-making processes may receive die-level final test data 214 from a final test subsystem 122 configured to perform final test processes after singulation and packaging of the wafer lot. For instance, the die-level final test data 214 may be received from the final test subsystem 122 during or following processes to evaluate the semiconductor device functionality at the conclusion of a fabrication manufacturing process.

By way of another example, the decision-making processes may receive statistical prediction feedback 216 from statistical prediction models 124 configured to perform statistical prediction processes. For example, the statistical prediction feedback 216 may be in the form of data sets or tables, graphs, models, or other form of physical or graphical display.

It is noted herein the dynamic rule-based decision-making, the electrical test subsystem 120 and corresponding electrical sort processes, the final test subsystem 122 and corresponding final test processes, and/or the statistical prediction models 124 and corresponding statistical prediction processes may be combined. For example, the combination may be based on a user-defined order of precedence (e.g., a weighting factor) to be taken into consideration when generating the one or more defect-guided dispositions 118.

The one or more defect-guided dispositions 118 may include one or more of the following non-limiting examples. For example, the one or more defect-guided dispositions 118 may be made based on a first threshold between the low defectivity or "low-risk" (or "good") semiconductor die 206 and the moderate defectivity or "at risk" semiconductor die 208, where the low defectivity or "low-risk" (or "good") semiconductor die 206 are above the first threshold and the moderate defectivity or "at risk" semiconductor die 208 are below the first threshold. By way of another example, the one or more defect-guided dispositions 118 may be made based on a second threshold between the moderate defectivity or "at risk" semiconductor die 208 and the high defectivity or "high-risk" semiconductor die 210, where the moderate defectivity or "at risk" semiconductor die 208 are above the second threshold and the high defectivity or "high-risk" semiconductor die 210 are below the second threshold.

In one non-limiting example, the one or more defect-guided dispositions 118 may include a disposition 218 to not perform (e.g., skip) burn-in and/or SLT. The disposition 218 may be selected for low defectivity or "low-risk" (or "good") semiconductor die 206. For example, semiconductor die 204 determined to be low defectivity or "low-risk" (or "good") semiconductor die 206 based upon a low weighted, aggregate score 116 (e.g., alone or in addition to data 212, 214, 216) may be directed to not perform (e.g., skip) burn-in and/or SLT. It is noted herein the disposition 218 may provide the highest chance to avoid additional test insertions into the low defectivity or "low-risk" (or "good") semiconductor die 206.

In another non-limiting example, the one or more defect-guided dispositions 118 may include a disposition 220 to perform burn-in and/or perform SLT. The disposition 220 may be selected for moderate defectivity or "at risk" semiconductor die 208. For example, semiconductor die 204 determined to be moderate defectivity or "at risk" semiconductor die 208 based upon the weighted, aggregate scores 116 (e.g., alone or in addition to additional data 212, 214, 216) may be directed to burn-in and/or SLT according to user defined rules before final disposition or release. For instance, the defect attributes (e.g., defect size, defect layer, defect location, defect type, or other defect attribute as described throughout the present disclosure) may be used to adaptively shape the duration and content of either burn-in and/or SLT to more effectively activate potential LRD present in the moderate defectivity or "at risk" semiconductor die 208. It is noted herein the disposition 220 may allow for the validation of the moderate defectivity "at risk" semiconductor die 208 by deciding to perform burn-in and/or the SLT and stress the moderate defectivity "at risk" semiconductor die 208 to activate potential LRD.

Although embodiments of the present disclosure illustrate the disposition 218 being to skip burn-in and/or SLT, while disposition 220 may be directed to performing burn-in and/or SLT, it is noted herein the disposition 218 made for low defectivity or "low-risk" (or "good") semiconductor die 206 and the disposition 220 made for the moderate defectivity "at risk" semiconductor die 208 are separate and independent with distinct and different factors taken into consideration by the defect-guided disposition controller 104, as described throughout the present disclosure.

In another non-limiting example, the one or more defect-guided dispositions 118 may include a disposition 222 to cull or "ink-out". The disposition 222 may be selected for high defectivity or "high-risk" semiconductor die 210. For example, semiconductor die 204 determined to be high defectivity or "high-risk" semiconductor die 210 based upon weighted, aggregate scores 116 (e.g., alone or in addition to additional data 212, 214, 216) may be culled or "inked-out" without performing either burn-in or SLT. It is noted herein the disposition 222 may result in the reduction of escapes entering into a supply chain when the high defectivity or "high-risk" semiconductor die 210 are removed (e.g., culled or inked out). In addition, it is noted herein the disposition 222 may result in the reduction of costs by not subjecting the outliers to additional (and/or unnecessary) burn-in and/or SLT.

It is noted herein the above non-limiting examples are provided solely for illustrative purposes of types of defect-guided dispositions 118.

Although the screening subsystem 102 and the defect-guided disposition controller 104 are illustrated as separate components of the system 100, it is noted herein the screening subsystem 102 and the defect-guided disposition controller 104 may be integrated together. For example, the screening subsystem 102 may be integrated into the defect-guided disposition controller 104 (e.g., be processes coded to operate on the defect-guided disposition controller 104), such that the defect-guided disposition controller 104 receives the semiconductor die data 114 from the semiconductor fab characterization subsystem 112. By way of another example, the defect-guided disposition controller 104 may be integrated into the screening subsystem 102 (e.g., be processes coded to operate on the screening subsystems 102), such that the screening subsystem 102 may generate the one or more defect-guided dispositions 118.

Figure 3:
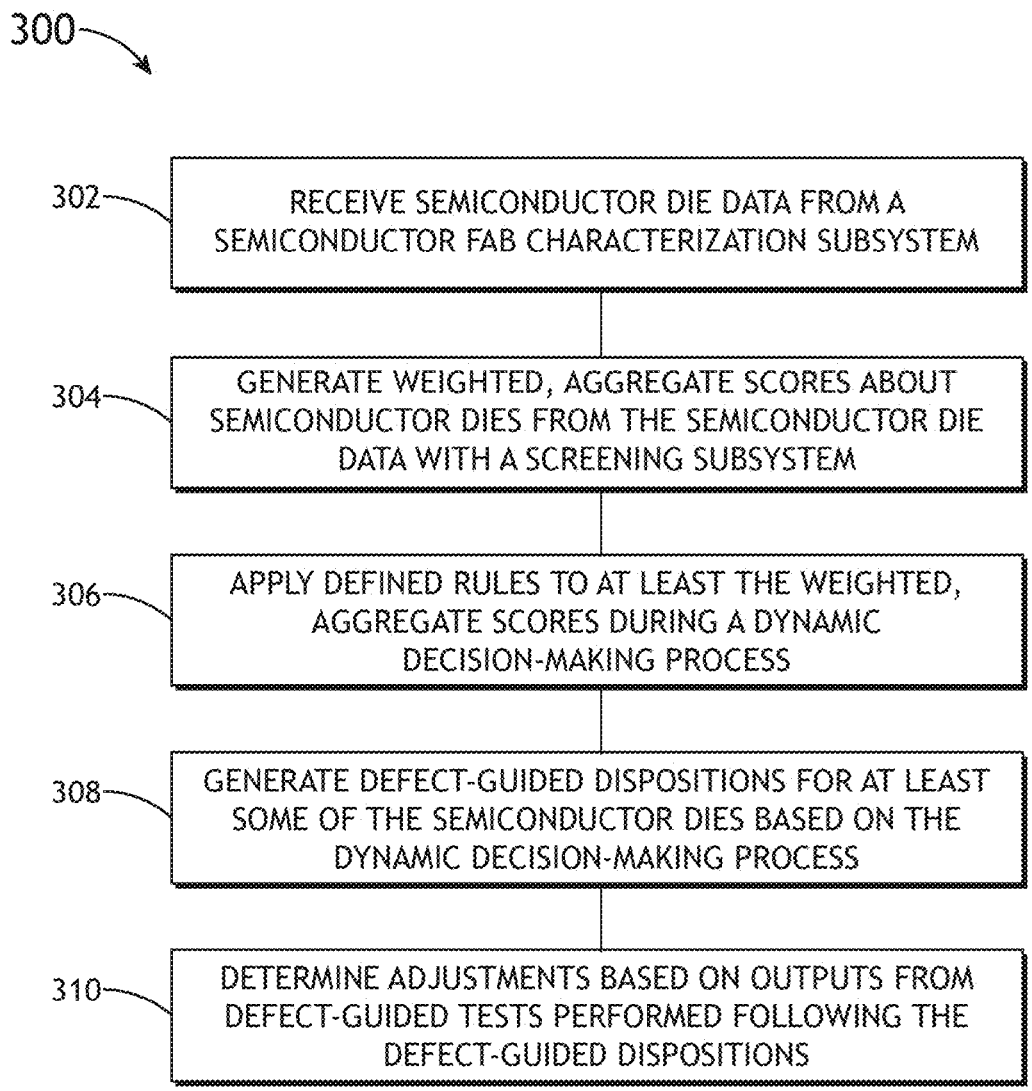
FIG. 3 is a flow diagram illustrating steps performed in a method for semiconductor defect-guided burn-in and system level tests (SLT), in accordance with one or more embodiments of the present disclosure.

FIG. 3 illustrates a method or process 300 for semiconductor defect-guided burn-in and system level tests (SLT), in accordance with one or more embodiments of the present disclosure. It is noted herein that the steps of method or process 300 may be implemented all or in part by the system 100 illustrated in FIGS. 1 and 2. It is further recognized, however, that the method or process 300 is not limited to the system 100 illustrated in FIGS. 1 and 2 in that additional or alternative system-level embodiments may carry out all or part of the steps of method or process 300.

In a step 302, semiconductor die data is received from a semiconductor fab characterization subsystem. In some embodiments, the semiconductor die data 114 is received by the screening subsystem 102 from the semiconductor fab characterization subsystem 112.

In a step 304, weighted, aggregate scores are generated about semiconductor dies from the semiconductor die data with a screening subsystem. In some embodiments, the screening subsystem 102 weighted, aggregate scores 116 separate or bin the semiconductor dies 204.

In a step 306, defined rules are applied to at least the weighted, aggregate scores during a dynamic decision-making process. In some embodiments, the defect-guided disposition controller 104 may use dynamic rule-based decision-making processes on the weighted, aggregate score 116 for each semiconductor die 204 based on a set of user-defined rules or pre-set rules for criteria on the weighted, aggregate score 116 (and/or the contributory elements for and/or to the weighted, aggregate score 116). For example, the weighted, aggregate score 116 may be used alone. By way of another example, the weighted, aggregate score 116 may be used in combination with other available test insertion or manufacturing data including, but not limited to, die-level electrical sort data 212, die-level final test data 214, statistical prediction feedback 216, or the like. The defined rules may be user-defined and received by the defect-guided disposition controller 104 (e.g., via the user interface 110). In addition or in the alternative, the defined rules may be pre-set within the defect-guided disposition controller 104. Further in addition or in the alternative, the defined rules may separate the semiconductor dies 204 based on the corresponding weighted, aggregate scores 116 and/or observed defects on the semiconductor dies 204.

It is noted herein the screening subsystem 102 may separate the semiconductor dies 204 as low defectivity or "low-risk" (or "good") semiconductor dies 206, moderate defectivity "at risk" semiconductor dies 208, or high defectivity semiconductor dies 210 during the binning of the semiconductor die data 114 into the weighted, aggregate scores 116. In addition, it is noted herein the defect-guided disposition controller 104 may separate the semiconductor dies 204 as low defectivity or "low-risk" (or "good") semiconductor dies 206, moderate defectivity "at risk" semiconductor dies 208, or high defectivity semiconductor dies 210 after receiving the weighted, aggregate scores 116.

In a step 308, defect-guided dispositions are generated for at least some of the semiconductor dies based on the dynamic decision-making process. In some embodiments, the defect-guided dispositions characterize each semiconductor die 204 of the plurality of semiconductor dies 204 as either a low defectivity or "low-risk" (or "good") semiconductor die 206, a moderate defectivity or "at risk" semiconductor die 208, or a high defectivity or "high-risk" semiconductor die 210. The characterization may involve merging or combining the weighted, aggregate scores 116 for the semiconductor die 204 with suitable wafer level data, die-level electrical sort data 212, and/or die-level final test data 214.

In one non-limiting example, low-defectivity "good" semiconductor die 206 may be identified via the merging or combining of data to create a bin of the semiconductor die population that can safely non perform (e.g., skip) burn-in and/or SLT following a disposition 218. It is noted herein this identification may save time and money with minimal risk of reliability failure. In addition, it is noted herein this identification may reduce yield losses from handling and the creation of "walking wounded" die damaged during burn-in that otherwise would have been satisfactory.

In another non-limiting example, moderate defectivity or "at risk" semiconductor die 208 with elevated risk may be identified due to defectivity levels via the merging or combining of data to create a bin that would be directed to burn-in and/or SLT based upon user defined criteria following a disposition 220. In identifying the moderate defectivity or "at risk" semiconductor die 208, the layer, type, and location of defects may be distinguished to shape the duration and content of burn-in and/or SLT, choosing parameters known to best "activate" that potential failure source. For devices that do fail SLT, the relevant defectivity data will provide a narrower field of potential root causes, which is an improvement over known open-loop methods.

In another non-limiting example, high defectivity or "high-risk" semiconductor die 210 or outlier die with weighted aggregate defectivity scores significantly different than the broader population may be identified via the merging or combining of data to create a bin that would be directed to be culled or "inked out" following a disposition 222 without performing either burn-in or SLT. It is noted herein the culling or "inking out" of the high defectivity or "high-risk" semiconductor die 210 may reduce cost-of-test by avoiding additional unnecessary steps while also reducing escapes of low-reliability semiconductor die into a supply chain.

In a step 310, adjustments are determined based on outputs from defect-guided tests performed following the defect-guided dispositions. In some embodiments, the adjustments are transmitted to the semiconductor fab characterization subsystem 112 to adjust fabrication processes and/or characterization processes via either a feed forward loop (e.g., to correct current semiconductor devices) or a feedback loop (e.g., to adjust future semiconductor devices) depending on the completeness of the fabrication processes.

For example, an incomplete fabrication process may be correctable via either the feed forward loop or the feedback loop, though the defect-guided disposition controller 104 may or may not take into account die-level electrical sort data 212 and/or die-level final test data 214 when generating the one or more defect-guided dispositions 118 regarding the use of burn-in and/or SLT for incomplete fabrication processes. By way of another example, a complete fabrication process may be correctable via the feedback loop, and the defect-guided disposition controller 104 may take into account die-level electrical sort data 212 and/or die-level final test data 214 when generating the one or more defect-guided dispositions 118 regarding the use of burn-in and/or SLT for complete fabrication processes. In this regard, the fabrication processes and/or characterization processes may be improved, leading to a reduction in cost (e.g., in time, money, or the like) for fabricators while maintaining a desired level of quality (e.g., PPB failure rates).

Although embodiments of the present disclosure illustrate the steps of the method or process 300 being performed by the defect-guided disposition controller 104, it is noted herein some or all of the steps of the method or process 300 may be performed by a server or controller communicatively coupled to the defect-guided disposition controller 104. For example, the server or controller may include processors and memory, and other communicatively-coupled components as described throughout the present disclosure.

Figure 4A:
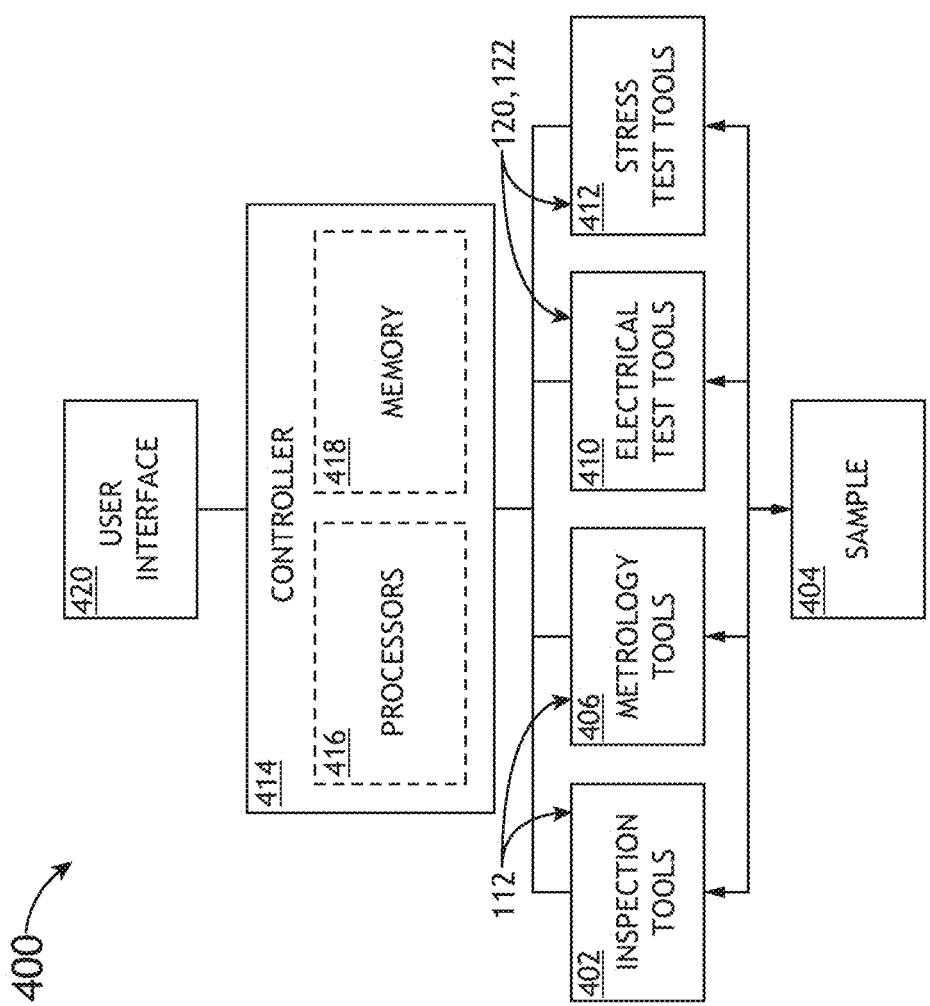
FIG. 4A is a block diagram view of a system for fabricating, characterizing, and/or testing of semiconductor devices, in accordance with one or more embodiments of the present disclosure.
Figure 4B:
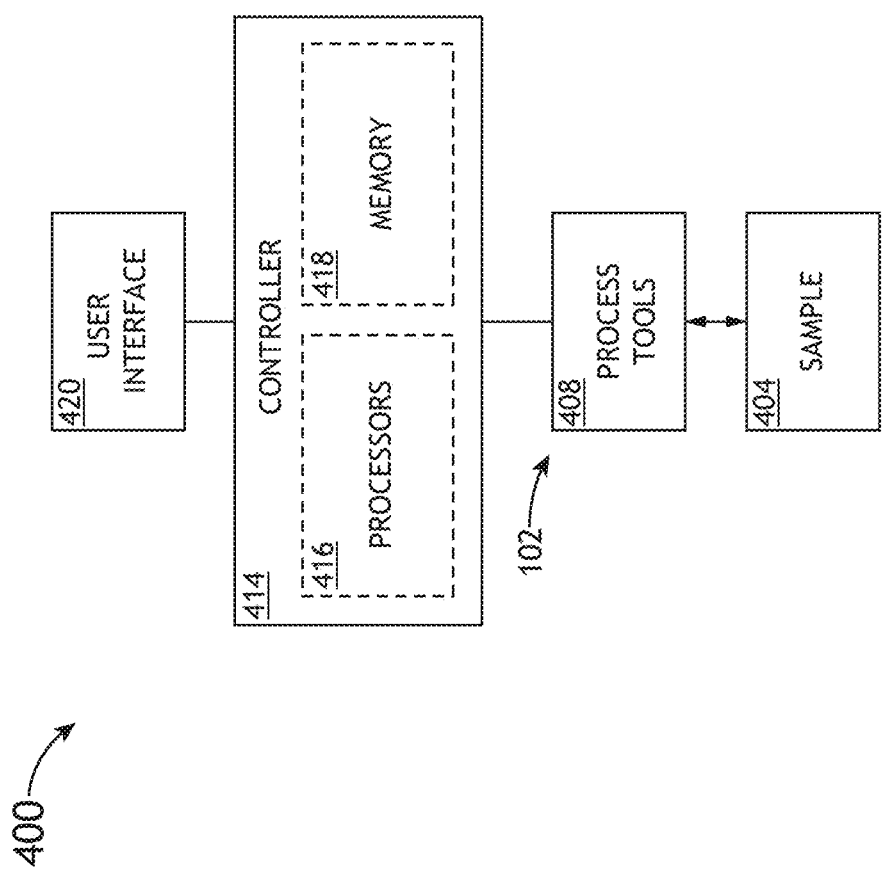
FIG. 4B is a block diagram view of a system for fabricating, characterizing, and/or testing of semiconductor devices, in accordance with one or more embodiments of the present disclosure.

FIGS. 4A and 4B illustrate block diagrams of a system 400 for fabricating, characterizing, and/or testing of semiconductor devices, in accordance with one or more embodiments of the present disclosure. It is noted herein the system 400 may be configured to perform processing steps to fabricate and/or analyze semiconductor devices and/or components (e.g., semiconductor dies) on semiconductor devices, as described throughout the present disclosure. In addition, it is noted herein the system 400 may include all of or a part of the system 100, as described throughout the present disclosure.

In some embodiments, the system 400 includes the semiconductor fab characterization subsystem 112, the electrical test subsystem 120, the final test subsystem 122, and/or component(s) configured to generate the statistical prediction models 124. It is noted herein the semiconductor fab characterization subsystem 112, the electrical test subsystem 120, the final test subsystem 122, and/or the component(s) configured to generate the statistical prediction models 124 may be standalone or may be at least partially combined or integrated together. In addition, it is noted herein the semiconductor fab characterization subsystem 112, the electrical test subsystem 120, the final test subsystem 122, and/or the component(s) configured to generate the statistical prediction models 124 may be standalone or may be at least partially combined or integrated with other components of the system 400, as described throughout the present disclosure.

In some embodiments, the semiconductor fab characterization subsystem 112 includes one or more characterization tools configured to output characterization measurements within (or as) semiconductor die data 114 (e.g., characterization data 114). For example, the characterization measurements may include, but are not limited to, process control inspections (e.g., sampling-based inspections), screening inspections at key semiconductor device layers, or the like. For purposes of the present disclosure, "characterization measurements" may refer to inline defect inspection and/or inline metrology measurements.

In one non-limiting example, the semiconductor fab characterization subsystem 112 may include at least one inspection tool 402 (e.g., an inline sample analysis tool) for detecting defects in one or more layers of a sample 404 (e.g., the semiconductor wafer 202). The semiconductor fab characterization subsystem 112 may generally include any number or type of inspection tools 402. For example, an inspection tool 402 may include an optical inspection tool configured to detect defects based on interrogation of the sample 404 with light from any source such as, but not limited to, a laser source, a lamp source, an X-ray source, or a broadband plasma source. By way of another example, an inspection tool 402 may include a particle-beam inspection tool configured to detect defects based on interrogation of the sample 404 with one or more particle beams such as, but not limited to, an electron beam, an ion beam, or a neutral particle beam. For instance, the inspection tool 402 may include a transmission electron microscope (TEM) or a scanning electron microscope (SEM). For purposes of the present disclosure, it is noted herein the at least one inspection tool 402 may be a single inspection tool 402 or may represent a group of inspection tools 402.

It is noted herein the sample 404 may be a semiconductor wafer of a plurality of semiconductor wafers, where each semiconductor wafer of the plurality of semiconductor wafers includes a plurality (e.g., 1, 2, . . . N number) of layers fabricated following a number (e.g., tens, hundreds, thousands) of steps performed by a number of semiconductor fabrication processes, where each layer of the plurality of layers includes a plurality of semiconductor dies, where each semiconductor die of the plurality of semiconductor dies includes a plurality of blocks. In addition, it is noted herein the sample 404 may be a semiconductor die package formed from a plurality of semiconductor dies arranged in a 2.5D lateral combination of a bare die on a substrate inside an advanced die package or a 3D die package.

For the purposes of the present disclosure, the term "defect" may refer to a physical defect found by an inline inspection tool, a metrology measurement outlier, or other physical characteristic of the semiconductor device that is deemed to be an anomaly. A defect may be considered to be any deviation of a fabricated layer or a fabricated pattern in a layer from design characteristics including, but not limited to, physical, mechanical, chemical, or optical properties. In addition, a defect may be considered to be any deviation in alignment or joining of components in a fabricated semiconductor die package. Further, a defect may have any size relative to a semiconductor die or features thereon. In this way, a defect may be smaller than a semiconductor die (e.g., on the scale of one or more patterned features) or may be larger than a semiconductor die (e.g., as part of a wafer-scale scratch or pattern). For example, a defect may include deviation of a thickness or composition of a sample layer before or after patterning. By way of another example, a defect may include a deviation of a size, shape, orientation, or position of a patterned feature. By way of another example, a defect may include imperfections associated with lithography and/or etching steps such as, but not limited to, bridges between adjacent structures (or lack thereof), pits, or holes. By way of another example, a defect may include a damaged portion of a sample 404 such as, but not limited to, a scratch, or a chip. For instance, a severity of the defect (e.g., the length of a scratch, the depth of a pit, measured magnitude or polarity of the defect, or the like) may be of importance and taken into consideration. By way of another example, a defect may include a foreign particle introduced to the sample 404. By way of another example, a defect may be a misaligned and/or mis-joined package component on the sample 404. Accordingly, it is to be understood that examples of defects in the present disclosure are provided solely for illustrative purposes and should not be interpreted as limiting.

In another non-limiting example, the semiconductor fab characterization subsystem 112 may include at least one metrology tool 406 (e.g., an inline sample analysis tool) for measuring one or more properties of the sample 404 or one or more layers thereof. For example, a metrology tool 406 may characterize properties such as, but not limited to, layer thickness, layer composition, critical dimension (CD), overlay, or lithographic processing parameters (e.g., intensity or dose of illumination during a lithographic step). In this regard, a metrology tool 406 may provide information about the fabrication of the sample 404, one or more layers of the sample 404, or one or more semiconductor dies of the sample 404 that may be relevant to the probability of manufacturing defects that may lead to reliability issues for the resulting fabricated devices. For purposes of the present disclosure, it is noted herein the at least one metrology tool 406 may be a single metrology tool 406 or may represent a group of metrology tools 406.

In some embodiments, the semiconductor fab characterization subsystem 112 includes at least one semiconductor manufacturing tool or process tool 408. It is noted herein the sample 404 may be moved between the one or more inspection tools 402, the one or more metrology tools 406, and the one or more process tools 408 during fabrication of the sample 404. For example, the process tool 408 may include any tool known in the art including, but not limited to, an etcher, scanner, stepper, cleaner, or the like. For instance, a fabrication process may include fabricating multiple dies distributed across the surface of a sample (e.g., a semiconductor wafer, or the like), where each die includes multiple patterned layers of material forming a device component. Each patterned layer may be formed by the process tool 408 via a series of steps including material deposition, lithography, etching to generate a pattern of interest, and/or one or more exposure steps (e.g., performed by a scanner, a stepper, or the like). By way of another example, the process tool 408 may include any tool known in the art configured to package and/or combine semiconductor dies into a 2.5D and/or 3D semiconductor die package. For instance, a fabrication process may include, but is not limited to, aligning semiconductor dies and/or electrical components on the semiconductor dies. In addition, a fabrication process may include, but is not limited to, joining the semiconductor dies and/or the electrical components on the semiconductor dies via hybrid bonding (e.g., die-to-die, die-to-wafer, wafer-to-wafer, or the like) solder, an adhesive, fasteners, or the like. For purposes of the present disclosure, it is noted herein the at least one process tool 408 may be a single process tool 408 or may represent a group of process tools 408. It is noted herein the terms "fabrication process" and "manufacturing process" may be considered equivalent, along with respective variants of the terms (e.g., "fabrication line" and "manufacturing line", "fabricator" and "manufacturer", or the like), for purposes of the present disclosure.

In some embodiments, the system 400 includes the electrical test subsystem 120 and/or the final test subsystem 122 for testing the functionality of one or more portions of a manufactured device. For example, the electrical test subsystem 120 and/or the final test subsystem 122 may be configured to generate the die-level electrical sort data 212 and/or die-level final test data 214. It is noted herein the sample 404 may be moved from the semiconductor fab characterization subsystem 112 to the electrical test subsystem 120 and/or the final test subsystem 122 following completion of the fabrication of the sample 404.

In one non-limiting example, the electrical test subsystem 120 and/or the final test subsystem 122 may include any number or type of electrical test tools 410 to complete a preliminary probing at a wafer level. For example, the preliminary probing may not be designed to try to force a failure at the wafer level.

In another non-limiting example, the electrical test subsystem 120 and/or the final test subsystem 122 may include any number or type of stress test tool 412 to test, inspect, or otherwise characterize the properties of one or more portions of a fabricated device at any point in the manufacturing cycle. For example, the stress test tool 412 may include, but is not limited to, a pre-burn-in electrical wafer sort and final test (e.g., an e-test) or a post-burn-in electrical test configured to vibrate the sample 404, heat the sample 404 (e.g., an oven or other heat source), cool the sample 404 (e.g., a freezer or other cold source), operate the sample 404 in a selected humidity level, operate the sample 404 at an incorrect voltage (e.g., a power supply) or another anomalous electrical condition, or the like. It is noted the sample 404 may be subjected to the above non-limiting tests either separately or in some combination.

In some embodiments, defects are identified using any combination of the semiconductor fab characterization subsystem 112 (e.g., inspection tools 402, metrology tools 406, or the like), the electrical test subsystem 120 and/or the final test subsystem 122 (e.g., including electrical test tools 410 and/or stress test tools 412, or the like), which are utilized before or after one or more processing steps (e.g., lithography, etching, aligning, joining, or the like) performed by one or more process tools 408 for layers of interest in the semiconductor dies and/or semiconductor die packages. In this regard, the defect detection at various stages of the manufacturing process may be referred to as inline defect detection.

In some embodiments, the system 400 includes a controller 414. The controller 414 may be communicatively coupled with any of the components of the system 400 including, but not limited to, the semiconductor fab characterization subsystem 112 (e.g., including the inspection tools 402, the metrology tools 406, and/or the process tools 408), the electrical test subsystem 120 and/or the final test subsystem 122 (e.g., including the electrical test tools 410 and/or the stress test tools 412), or the like. It is noted herein the embodiments illustrated in FIG. 4A and the embodiments illustrated in FIG. 4B may be considered parts of the same system 400 or parts of different systems 400, for purposes of the present disclosure. In addition, it is noted herein components within the system 400 illustrated in FIG. 4A and components within the system 400 illustrated in FIG. 4B may be in direct communication or may communicate through the controller 414.

The controller 414 may include one or more processors 416 configured to execute program instructions maintained on memory 418 (e.g., a memory medium, memory device, or the like). The controller 414 may be configured to perform one or all of the steps of the method or process 200 and/or a method or process 500 (e.g., as described throughout the present disclosure). In this regard, the subsystems 112, 120, and/or 122 may be stored in and/or configured to be performed by the controller 414. It is noted herein, however, the subsystems 112, 120, and/or 122 may be separate from the controller 414 and configured to be in communication with the controller 414 (e.g., either directly or through a server or controller communicatively coupled to the controller 414, where the server or controller may include processors and memory, and other communicatively-coupled components as described throughout the present disclosure).

The one or more processors 416 may include any processor or processing element known in the art. For the purposes of the present disclosure, the term "processor" or "processing element" may be broadly defined to encompass any device having one or more processing or logic elements (e.g., one or more graphics processing units (GPU), microprocessing units (MPU), systems-on-a-chip (SoC), one or more application specific integrated circuit (ASIC) devices, one or more field programmable gate arrays (FPGAs), or one or more digital signal processors (DSPs)). In this sense, the one or more processors 416 may include any device configured to execute algorithms and/or instructions (e.g., program instructions stored in memory). In one embodiment, the one or more processors 416 may be embodied as a desktop computer, mainframe computer system, workstation, image computer, parallel processor, networked computer, or any other computer system configured to execute a program configured to operate or operate in conjunction with components of the systems 100 and/or 400, as described throughout the present disclosure.

The memory 418 may include any storage medium known in the art suitable for storing program instructions executable by the associated respective one or more processors 416. For example, the memory 418 may include a non-transitory memory medium. By way of another example, the memory 418 may include, but is not limited to, a read-only memory (ROM), a random-access memory (RAM), a magnetic or optical memory device (e.g., disk), a magnetic tape, a solid-state drive and the like. It is further noted that the memory 418 may be housed in a common controller housing with the one or more processors 416. In one embodiment, the memory 418 may be located remotely with respect to the physical location of the respective one or more processors 416. For instance, the respective one or more processors 416 may access a remote memory (e.g., server), accessible through a network (e.g., internet, intranet, and the like).

In another embodiment, the system 400 includes a user interface 420 coupled (e.g., physically coupled, electrically coupled, communicatively coupled, or the like) to the controller 414. For example, the user interface 420 may be a separate device coupled to the controller 414. By way of another example, the user interface 420 and the controller 414 may be located within a common or shared housing. It is noted herein, however, the controller 414 may not include, require, or be coupled to the user interface 420.

The user interface 420 may include, but is not limited to, one or more desktops, laptops, tablets, and the like. The user interface 420 may include a display used to display data of the systems 100 and/or 400 to a user. The display of the user interface 420 may include any display known in the art. For example, the display may include, but is not limited to, a liquid crystal display (LCD), an organic light-emitting diode (OLED) based display, or a CRT display. Those skilled in the art should recognize that any display device capable of integration with the user interface 420 is suitable for implementation in the present disclosure. In another embodiment, a user may input selections and/or instructions responsive to data displayed to the user via a user input device of the user interface 420.

Figure 5:
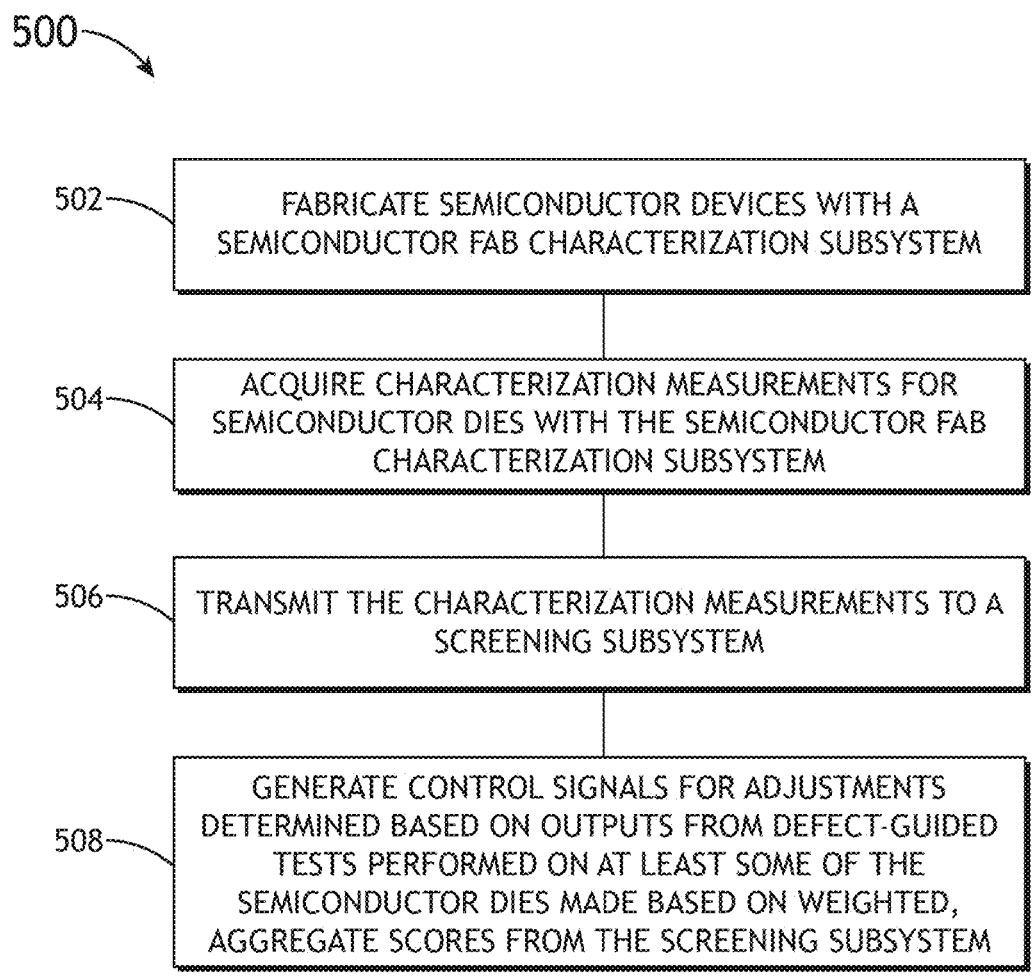
FIG. 5 is a flow diagram illustrating steps performed in a method for fabricating, characterizing, and/or testing of semiconductor devices, in accordance with one or more embodiments of the present disclosure.

FIG. 5 illustrates a method or process 500 for fabricating, characterizing, and/or testing of semiconductor devices, in accordance with one or more embodiments of the present disclosure. It is noted herein that the steps of method or process 500 may be implemented all or in part by the system 400 illustrated in FIGS. 4A and 4B. It is further recognized, however, that the method or process 500 is not limited to the system 400 illustrated in FIGS. 4A and 4B in that additional or alternative system-level embodiments may carry out all or part of the steps of method or process 500.

In a step 502, semiconductor devices are fabricated with a semiconductor fab characterization subsystem. In some embodiments, the semiconductor wafers 202 are fabricated via a plurality of semiconductor fabrication processes. For example, the semiconductor fab characterization subsystem 112 may include, but is not limited to, one or more process tools 408 configured to manufacture semiconductor devices including 1, 2, . . . N number of layers fabricated following a number (e.g., tens, hundreds, thousands) of steps performed by a number of semiconductor fabrication processes.

In a step 504, characterization measurements are acquired for semiconductor dies with the semiconductor fab characterization subsystem. In some embodiments, the characterization measurements are acquired by the semiconductor fab characterization subsystem 112. For example, characterization measurements may be performed by a plurality of characterization tools (e.g., inspection tools 402 and/or metrology tools 406) during (e.g., before steps, between steps, and/or after steps of) the fabrication of the one or more semiconductor wafers 202 via the plurality of semiconductor fabrication processes performed by the plurality of process tools 408.

In a step 506, the characterization measurements are transmitted to a screening subsystem. In some embodiments, the characterization measurements are transmitted as characterization data 114 or semiconductor die data 114 to the screening subsystem 102. The screening subsystem 102 may generate the weighted, aggregate scores 116 based on the characterization measurements. In some embodiments, the defect-guided disposition controller 104 generates one or more defect-guided dispositions 118 based on the weighted, aggregate scores 116.

It is noted herein the one or more semiconductor wafers 202 may be transferred to the electrical test subsystem 120 and/or the final test subsystem 122 sequentially, concurrently, or simultaneously as the transmission of characterization measurements to the screening subsystem 102, where the electrical test subsystem 120 may be configured to generate die-level electrical sort data 212 and the final test subsystem 122 may be configured to generate die-level final test data 214, respectively.

In a step 508, control signals are generated for adjustments determined based on outputs from defect-guided tests performed on at least some of the semiconductor dies made based on weighted, aggregate scores from the screening subsystem. In some embodiments, the one or more control signals are directed to at least one of the fabricating, characterizing, or testing of the one or more semiconductor wafers 202. For example, the one or more control signals may adjust the semiconductor fab characterization subsystem 112 and/or the one or more fabrication processes or methods or the one or more characterization processes or methods employed by the semiconductor fab characterization subsystem 112, via either a feed forward loop (e.g., to correct current semiconductor devices) or a feedback loop (e.g., to adjust future semiconductor devices) depending on the completeness or the fabrication processes. For example, an incomplete fabrication process may be correctable via either the feed forward loop or the feedback loop, though the defect-guided disposition controller 104 may or may not take into account die-level electrical sort data 212 and/or die-level final test data 214 when generating the one or more defect-guided dispositions 118 regarding the use of burn-in and/or SLT for incomplete fabrication processes. By way of another example, a complete fabrication process may be correctable via the feedback loop, and the defect-guided disposition controller 104 may take into account die-level electrical sort data 212 and/or die-level final test data 214 when generating the one or more defect-guided dispositions 118 regarding the use of burn-in and/or SLT for complete fabrication processes.

Although embodiments of the present disclosure illustrate the steps of the method or process 500 being performed by the controller 414, it is noted herein some or all of the steps of the method or process 500 may be performed by a server or controller communicatively coupled to the controller 414. For example, the server or controller may include processors and memory, and other communicatively-coupled components as described throughout the present disclosure.

It is noted herein the methods or processes 300 and 500 are not limited to the steps and/or sub-steps provided. The methods or processes 300 and 500 may include more or fewer steps and/or sub-steps. The methods or processes 300 and 500 may perform the steps and/or sub-steps simultaneously. The methods or processes 300 and 500 may perform the steps and/or sub-steps sequentially, including in the order provided or an order other than provided. Therefore, the above description should not be interpreted as a limitation on the scope of the present disclosure but merely an illustration.

In this regard, the systems and methods of the present disclosure lower escapes by ensuring the most defective semiconductor die undergo extra quality validation. The systems and methods of the present disclosure also lower cost of test by not performing (e.g., skip) burn-in and/or SLT on semiconductor die above a select threshold. The systems and methods of the present disclosure also lower cost of test by culling semiconductor die below a select threshold, eliminating unnecessary burn-in and/or SLT. The systems and methods of the present disclosure also shape the duration and parameters of burn-in and/or SLT to improve its efficacy for the defects present. The systems and methods of the present disclosure also manage conflicting business priorities of cost-of-test reduction and quality improvement based on data received from upstream fabs. The systems and methods of the present disclosure also connect the front-end fabs with back-end test as a differentiating capability to help show continuous improvement toward PPB and total cost reduction goals.

In one non-limiting example of a use case for the systems and methods of the present disclosure, a quality team at a semiconductor manufacturer providing mission and safety critical parts observes an unsatisfactory level of low reliability devices escaping into inventory. A device engineer and test engineer have maximized the design for test, and the ATE structural test coverage approaches 99% of transistors. However, complex designs and exploding transistor count leaves millions of transistors still untested, leading to coverage gaps. These coverage gaps, combined with untestable LRD and fault model deficiencies, means that escapes of low reliability die continue at unacceptable rates (e.g., especially early in the ramp when lower yield amplifies these effects). To compensate, an additional burn-in and/or SLT may be employed to further screen potential low reliability parts from entering a supply chain.

Optimizing the addition of these slow and costly steps may be difficult, with choosing to sample 100% adding significant Cost-Of-Test by eroding margins and slowing production, while also potentially creating unwanted yield loss of otherwise good die. In addition, sub-sampling may be problematic as it is largely based on data from upstream electrical test that has inherent gaps. Further, historical fab manufacturing data is rarely available from deeply sub-sampled process control inspections and lacks a holistic assessment of the defectivity of the semiconductor die relative to the population or the defect size, defect layer, defect location, defect type, or other defect attribute as described throughout the present disclosure.

With the advent of screening in the manufacturing fab, relevant data may be imported from a separate but correlated source into a disposition of which semiconductor die to send to burn-in and/or SLT (e.g., which may occur individually, sequentially, simultaneously, or concurrently).

Advantages of the present disclosure are directed to systems and methods for semiconductor defect-guided burn-in and SLT. Advantages of the present disclosure are also directed to providing a more effective method to determine which semiconductor die are directed to burn-in and/or SLT. Advantages of the present disclosure are directed to using weighted, aggregate screening data (e.g., weighted, aggregate inline defect and/or metrology outlier data from I-PAT or other screening methods) in the optimization of burn-in and/or SLT. Advantages of the present disclosure are directed to assessing if individual "at-risk" die should undergo burn-in, SLT, or both. Advantages of the present disclosure are directed to merging with I-PAT data with electrical test data and statistical sampling models to determine which "low-risk" die are appropriate to not perform (e.g., skip) burn-in and/or SLT, and which "high-risk" die should be culled before burn-in and/or SLT. Advantages of the present disclosure are directed to modifying the content and duration of burn-in and/or system level test program parameters using inline defect data from screening inspections in the manufacturing fab.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system comprising:
a defect-guided disposition controller communicatively coupled to an inline defect part average testing (I-PAT) subsystem, wherein the defect-guided disposition controller includes one or more processors and memory, wherein the memory is configured to store a set of program instructions, wherein the one or more processors are configured to execute program instructions causing the one or more processors to:
receive a plurality of inline defect part average testing (I-PAT) scores from the I-PAT subsystem, wherein the plurality of I-PAT scores is generated by the I-PAT subsystem based on semiconductor die data for a plurality of semiconductor dies, wherein the semiconductor die data includes characterization measurements for the plurality of semiconductor dies, wherein each I-PAT score of the plurality of I-PAT scores represents a defectivity determined by the I-PAT subsystem based on a characterization measurement of a corresponding semiconductor die of the plurality of semiconductor dies;
apply one or more rules to the plurality of I-PAT scores during a dynamic decision-making process; and
generate one or more defect-guided dispositions regarding at least one of burn-in or a system level test (SLT) for at least one semiconductor die of the plurality of semiconductor dies based on the dynamic decision-making process.

2. The system of claim 1, wherein the one or more processors are further configured to execute program instructions causing the one or more processors to:
determine one or more adjustments to a semiconductor fab characterization subsystem based on outputs from one or more defect-guided tests performed following the one or more defect-guided dispositions, wherein the semiconductor fab characterization subsystem is configured to acquire the characterization measurements of the semiconductor die data.

3. The system of claim 1, wherein at least one I-PAT score of the plurality of I-PAT scores corresponds to a low defectivity semiconductor die, wherein the one or more defect-guided dispositions includes not performing either burn-in or SLT on the low defectivity semiconductor die.

4. The system of claim 1, wherein at least one I-PAT score of the plurality of I-PAT scores corresponds to a moderate defectivity semiconductor die, wherein the one or more defect-guided dispositions includes performing at least one of burn-in or SLT on the moderate defectivity semiconductor die, wherein the at least one of burn-in or SLT is adaptively shaped based on one or more defect attributes.

5. The system of claim 4, wherein the one or more defect attributes include one or more of defect size, defect layer, defect location, or defect type.

6. The system of claim 1, wherein at least one I-PAT score of the plurality of I-PAT scores corresponds to a high defectivity semiconductor die, wherein the one or more defect-guided dispositions includes culling or inking out the high defectivity semiconductor die without performing either burn-in or SLT.

7. The system of claim 1, wherein the one or more processors are further configured to execute program instructions causing the one or more processors to:
apply the one or more rules to the plurality of I-PAT scores and at least one of die-level electrical sort data, die-level final test data, or statistical prediction feedback during the dynamic decision-making process.

8. A method comprising:
receiving, via a defect-guided disposition controller, a plurality of inline defect part average testing (I-PAT) scores from an inline defect part average testing (I-PAT) subsystem, wherein the plurality of I-PAT scores is generated by the I-PAT subsystem based on semiconductor die data for a plurality of semiconductor dies, wherein the semiconductor die data includes characterization measurements for the plurality of semiconductor dies, wherein each I-PAT score of the plurality of I-PAT scores represents a defectivity determined by the I-PAT subsystem based on a characterization measurement of a corresponding semiconductor die of the plurality of semiconductor dies;
applying, via the defect-guided disposition controller, one or more rules to the plurality of I-PAT scores during a dynamic decision-making process; and
generating, via the defect-guided disposition controller, one or more defect-guided dispositions regarding at least one of burn-in or a system level test (SLT) for at least one semiconductor die of the plurality of semiconductor dies based on the dynamic decision-making process.

9. The method of claim 8, further comprising:
determining one or more adjustments to a semiconductor fab characterization subsystem based on outputs from one or more defect-guided tests performed following the one or more defect-guided dispositions, wherein the semiconductor fab characterization subsystem is configured to acquire the characterization measurements of the semiconductor die data.

10. The method of claim 8, wherein at least one I-PAT score of the plurality of I-PAT scores corresponds to a low defectivity semiconductor die, wherein the one or more defect-guided dispositions includes not performing either burn-in or SLT on the low defectivity semiconductor die.

11. The method of claim 8, wherein at least one I-PAT score of the plurality of I-PAT scores corresponds to a moderate defectivity semiconductor die, wherein the one or more defect-guided dispositions includes performing at least one of burn-in or SLT on the moderate defectivity semiconductor die, wherein the at least one of burn-in or SLT is adaptively shaped based on one or more defect attributes.

12. The method of claim 11, wherein the one or more defect attributes include one or more of defect size, defect layer, defect location, or defect type.

13. The method of claim 8, wherein at least one I-PAT score of the plurality of I-PAT scores corresponds to a high defectivity semiconductor die, wherein the one or more defect-guided dispositions includes culling or inking out the high defectivity semiconductor die without performing either burn-in or SLT.

14. The method of claim 8, further comprising:
applying, via the defect-guided disposition controller, the one or more rules to the plurality of I-PAT scores and at least one of die-level electrical sort data, die-level final test data, or statistical prediction feedback during the dynamic decision-making process.

15. A system comprising:
an inline defect part average testing (I-PAT) subsystem, wherein the I-PAT subsystem is configured to receive semiconductor die data for a plurality of semiconductor dies and generate a plurality of inline defect part average testing (I-PAT) scores based on the semiconductor die data, wherein the semiconductor die data includes characterization measurements for the plurality of semiconductor dies, wherein each I-PAT score of the plurality of I-PAT scores represents a defectivity determined by the I-PAT subsystem based on a characterization measurement of a corresponding semiconductor die of the plurality of semiconductor dies; and a defect-guided disposition controller communicatively coupled to the I-PAT subsystem, wherein the defect-guided disposition controller includes one or more processors and memory, wherein the memory is configured to store a set of program instructions, wherein the one or more processors are configured to execute program instructions causing the one or more processors to:

receive the plurality of I-PAT scores from the I-PAT subsystem;

apply one or more rules to the plurality of I-PAT scores during a dynamic decision-making process; and generate one or more defect-guided dispositions regarding at least one of burn-in or a system level test (SLT) for at least one semiconductor die of the plurality of semiconductor dies based on the dynamic decision-making process.

16. The system of claim 15, further comprising:
a semiconductor fab characterization subsystem configured to acquire the characterization measurements of the semiconductor die data,
wherein the one or more processors are further configured to execute program instructions causing the one or more processors to:
determine one or more adjustments to the semiconductor fab characterization subsystem based on outputs from one or more defect-guided tests performed following the one or more defect-guided dispositions.

17. The system of claim 15, wherein at least one I-PAT score of the plurality of I-PAT scores corresponds to a low defectivity semiconductor die, wherein the one or more defect-guided dispositions includes not performing either burn-in or SLT on the low defectivity semiconductor die.

18. The system of claim 15, wherein at least one I-PAT score of the plurality of I-PAT scores corresponds to a moderate defectivity semiconductor die, wherein the one or more defect-guided dispositions includes performing at least one of burn-in or SLT on the moderate defectivity semiconductor die, wherein the at least one of burn-in or SLT is adaptively shaped based on one or more defect attributes.

19. The system of claim 18, wherein the one or more defect attributes include one or more of defect size, defect layer, defect location, or defect type.

20. The system of claim 15, wherein at least one I-PAT score of the plurality of I-PAT scores corresponds to a high defectivity semiconductor die, wherein the one or more defect-guided dispositions includes culling or inking out the high defectivity semiconductor die without performing either burn-in or SLT.

21. The system of claim 15, wherein the one or more processors are further configured to execute program instructions causing the one or more processors to:
Apply the one or more rules to the plurality of I-PAT scores and at least one of die-level electrical sort data, die-level final test data, or statistical prediction feedback during the dynamic decision-making process.

22. The system of claim 15, wherein the I-PAT subsystem is configured to bin the plurality of I-PAT scores prior to transmission of the plurality of I-PAT scores to the defect-guided disposition controller.

23. The system of claim 15, wherein the I-PAT subsystem is configured to receive the semiconductor die data in a first data format, and transmit the plurality of I-PAT scores in a second data format.

24. The system of claim 15, wherein the I-PAT subsystem is configured to convert the plurality of I-PAT scores from a non-standardized data format into a standardized data format prior to transmission of the plurality of I-PAT scores to the defect-guided disposition controller.

25. The system of claim 15, wherein the defect-guided disposition controller is configured to convert the plurality of I-PAT scores from a non-standardized data format into a standardized data format after receipt of the plurality of I-PAT scores from the I-PAT subsystem.

* * * * *